United States Patent [19]

Lee

[11] Patent Number: 5,720,843
[45] Date of Patent: Feb. 24, 1998

[54] ELECTRICAL INTERCONNECTION METHOD

[75] Inventor: Chang-hoon Lee, Seoul, Rep. of Korea

[73] Assignee: Samsung Display Devices Co., Ltd., Rep. of Korea

[21] Appl. No.: 555,332

[22] Filed: Nov. 8, 1995

[30] Foreign Application Priority Data

Dec. 29, 1994 [KR] Rep. of Korea ............ 94-38991

[51] Int. Cl.$^6$ ........................................ H05K 3/32
[52] U.S. Cl. .................. 156/276; 156/292; 156/305; 29/832; 29/842; 361/768; 361/770
[58] Field of Search ............ 174/88 R, 94 R, 174/259, 261; 361/767, 768, 770, 784; 29/831, 832, 842; 156/276, 242, 297, 305, 306.3, 244.22, 292, 309.6; 264/271.1, 272.11

[56] References Cited

U.S. PATENT DOCUMENTS

| | | | |
|---|---|---|---|
| 4,696,860 | 9/1987 | Epperson | 428/325 |
| 5,076,485 | 12/1991 | MacKay | 156/276 |
| 5,332,869 | 7/1994 | Hagiwara | 174/259 |
| 5,588,894 | 12/1996 | Jin et al. | 445/24 |

*Primary Examiner*—Michael W. Ball
*Assistant Examiner*—Michael A. Tolin
*Attorney, Agent, or Firm*—Rothwell, Figg, Ernst & Kurz

[57] ABSTRACT

An electrical interconnection method, where two substrates are interconnected by an electrical connection medium, includes the steps of: depositing conductive particles on the connection surface of one of two substrates which are to be interconnected; depositing paste on the connection surface of another substrate; and interconnecting the connection surfaces of the two substrates. Also, the interconnection method according to another embodiment embodiment includes the steps of: depositing conductive particles on the connection surface of one of two substrates which are to be interconnected; contacting the connection surfaces of the two substrates; and injecting paste into a gap between the two substrates to interconnect the two substrates.

4 Claims, 3 Drawing Sheets

ELECTRICAL INTERCONNECTION METHOD

BACKGROUND OF THE INVENTION

The present invention relates to an electrical interconnection method, and more particularly, to an improved electrical interconnection method for interconnecting two objects using an electrical interconnection medium.

The interconnection of an electrical apparatus is generally performed using a medium. For example, a conductive adhesive is generally used when two substrates are interconnected.

FIGS. 1 and 2 are diagrams showing a conventional electrical interconnection method.

First, as shown in FIG. 1, electrical terminals 2 are disposed on the opposing surfaces of substrates 1 and 4 which are to be interconnected. After depositing a conductive anisotropic adhesive 6 including conductive particles 5 and an adhesive or paste 3 on the inner side of one substrate 1, two substrates are interconnected by compression, as shown in FIG. 2.

This connection method is used for connecting a substrate to an integrated circuit (IC) or ribbon cable. Particularly, the connection structure is used in chip-on-glass (COG) mounting technology.

According to a well-known interconnection method (U.S. Pat. No. 4,113,981), first a substance composed by mixing the paste and the conductive particles is deposited on the connection surface of one of two substrates. The substrates are then connected with each other.

In the resultant connection structure, upper and lower terminals are electrically connected through the conductive particles, but the adjacent terminals on the same substrate are prevented from shorting. When the conductive particles are included in the paste, the particles tend to settle due to the difference of specific gravity. Also, when this substance is manufactured, it is difficult to control the distribution of particles in the paste, and the adjacent terminals may be shorted if the distribution of particles is not even.

SUMMARY OF THE INVENTION

It is an object of the present invention, to provide an electrical interconnection method by which the particles can be evenly distributed and particle settling can be prevented.

To achieve the above object, an electrical interconnection method according to the present invention comprises the steps of: depositing conductive particles on the connection surface of one of two substrates which are to be interconnected; depositing paste on the connection surface of another substrate; and interconnecting the connection surfaces of the two substrates.

To achieve the above object, an electrical interconnection method according to the present invention comprises the steps of: depositing conductive particles on the connection surface of one of two substrates which are to be interconnected; contacting the connection surfaces of the two substrates; and injecting paste into a gap between the two substrates to interconnect the two substrates.

In the above methods according to the present invention, it is preferable that the conductive particles are sprayed while being dispersed in a volatile medium.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
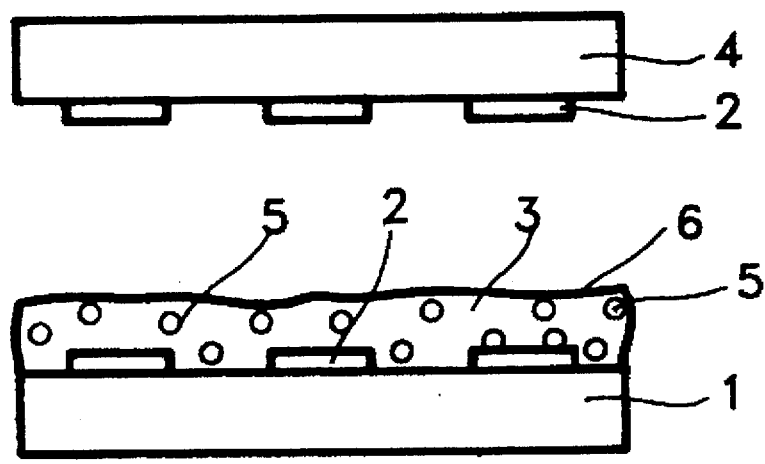
FIGS. 1 and 2 are cross-sectional views for illustrating a conventional electrical interconnection method.
Figure 2:
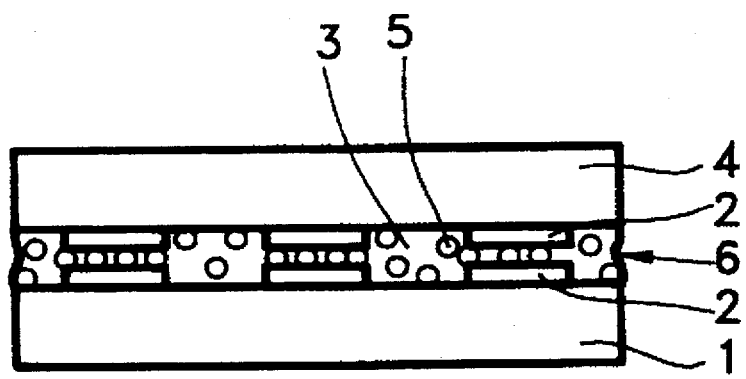
Figure 3:
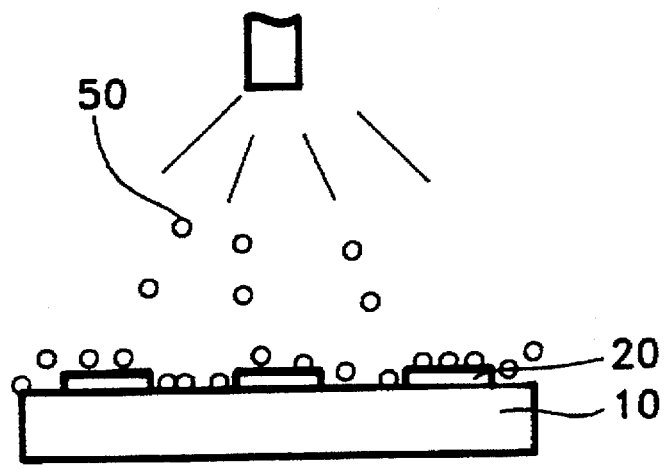
FIGS. 3 to 5 are cross-sectional views for illustrating an electrical interconnection method according to a preferred embodiment of the present invention.

Referring to FIG. 3, first, conductive particles 50 are sprayed on the connection surface of one of two substrates 10 and 40 which are to be interconnected, wherein the connection surface on which conductive particles 50 are sprayed has the electrical terminals.

Figure 4:
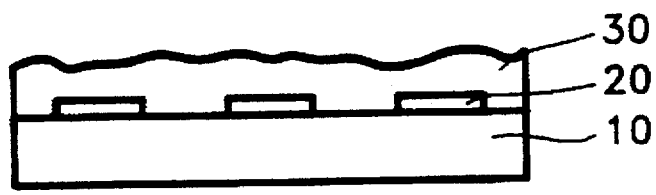

As shown in FIG. 4, pure paste 30 is deposited on the connection surface of another substrate 40 of the two substrates to be interconnected.

Figure 5:
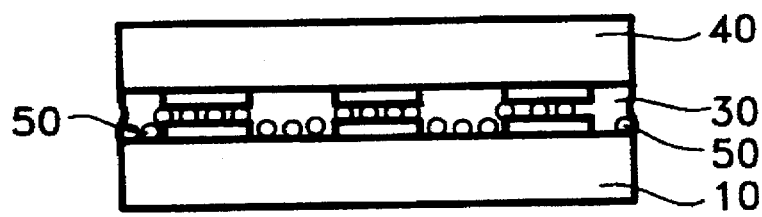

Also, as shown in FIG. 5, substrates 10 and 40 are interconnected so that pairs of electrical terminals 20 are electrically interconnected.

In the above preferred embodiment of the present invention, it is preferable that conductive particles 50 are sprayed while being dispersed in alcohol or freon. As a result, temporary adhesive force with respect to the substrate can be enhanced and the particles can be evenly distributed, to thereby maintain an uniform connection resistance.

Figure 6:
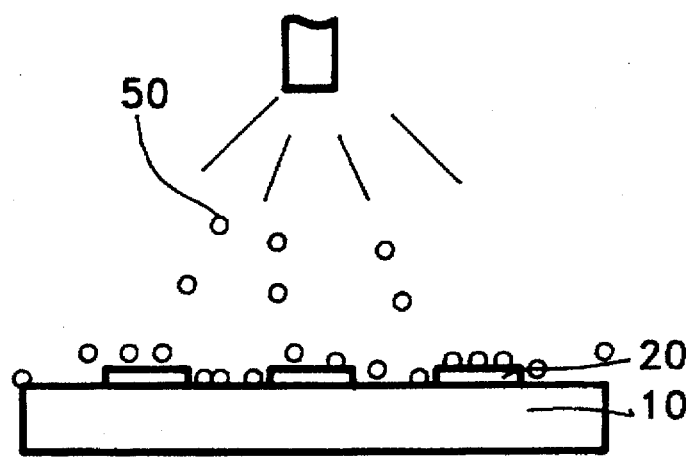
FIGS. 6 to 8 are cross-sectional views for illustrating an electrical interconnection method according to another preferred embodiment of the present invention.

Referring to FIG. 6, first, conductive particles 50 are sprayed on the connection surface of one of two substrates 10 and 40 which are to be interconnected, wherein the connection surface on which conductive particles 50 are sprayed has the electrical terminals 20.

Figure 7:
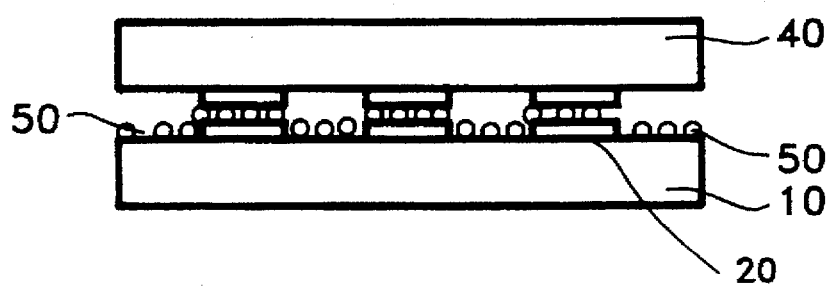

In FIG. 7, substrates 10 and 40 are made to contact so that pairs of electrical terminals 20 are electrically interconnected.

Figure 8:
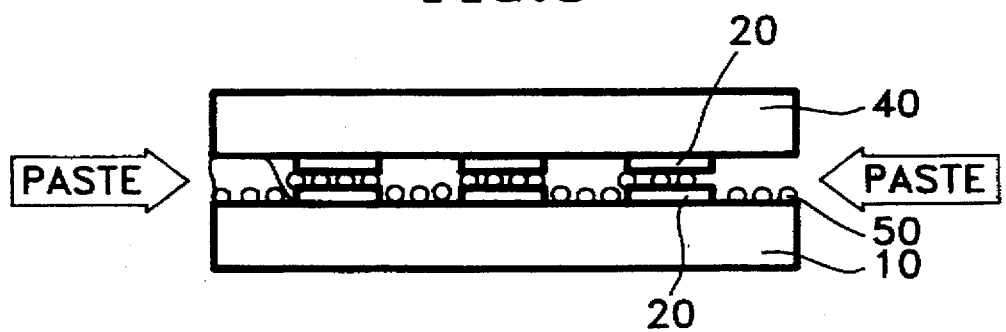

As shown in FIG. 8, paste 30 is injected into a gap between substrates 10 and 40, to thereby connect substrates 10 and 40.

In the above second preferred embodiment of the present invention, it is preferable that conductive particles 50 are sprayed while being dispersed in alcohol or freon. As a result, temporary adhesive force with respect to the substrate can be enhanced and the particles can be evenly distributed, to thereby maintain an uniform connection resistance.

According to the above-described electrical interconnection method of the present invention, the sprayed conductive particles are distributed in a mono-layer since the conductive particles are sprayed with respect to the substrate. Here, the volatile medium used for spraying is immediately evaporated after spraying, so that the final product includes no volatile medium. When the particles are sprayed according to the above method, the distribution density of the particles and their distribution state can be easily controlled. Also, in the another preferred embodiment of the present invention, the paste is injected through the gap between two substrates, compared with the conventional method. The injection can be performed by a capillary action generated in the gap between two substrates.

As described above, according to the electrical interconnection method of the present invention, the settling of particles in the paste can be overcome and the distribution of the conductive particles can be easily controlled. Thus, manufacture of a defective product caused from the poor distribution of the conductive particles and the poor deposition state can be prevented.

What is claimed is:

1. An electrical interconnection method for interconnecting a first substrate having a connection surface with a second substrate having a connection surface, said method comprising the steps of:

(a) depositing conductive particles on the connection surface of either the first substrate or the second substrate of said first and second substrate which are to be interconnected;

(b) contacting the connection surfaces of said first and second substrates; and (c) injecting paste into a gap between said first and second substrates to interconnect said first and second substrates.

2. An electrical interconnection method as claimed in claim 1, wherein said conductive particles are sprayed while being dispersed in a volatile medium.

3. An electrical interconnection method as claimed in claim 2, wherein said volatile medium is alcohol.

4. An electrical interconnection method as claimed in claim 2, wherein said volatile medium is freon.

* * * * *